United States Patent
Rofougaran et al.

(10) Patent No.: US 9,329,261 B2
(45) Date of Patent: May 3, 2016

(54) METHOD AND SYSTEM FOR DYNAMIC CONTROL OF OUTPUT POWER OF A LEAKY WAVE ANTENNA

(75) Inventors: Ahmadreza Rofougaran, Newport Coast, CA (US); Maryam Rofougaran, Ranhco Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 523 days.

(21) Appl. No.: 12/751,777

(22) Filed: Mar. 31, 2010

(65) Prior Publication Data

US 2010/0309069 A1 Dec. 9, 2010

Related U.S. Application Data

(60) Provisional application No. 61/246,618, filed on Sep. 29, 2009, provisional application No. 61/185,245, filed on Jun. 9, 2009.

(51) Int. Cl.
| | |
|---|---|
| *H01Q 13/20* | (2006.01) |
| *H01Q 9/00* | (2006.01) |
| *G01S 13/06* | (2006.01) |
| *H01Q 1/22* | (2006.01) |

(Continued)

(52) U.S. Cl.
CPC .............. *G01S 13/06* (2013.01); *G06K 7/10316* (2013.01); *H01Q 1/2283* (2013.01); *H01Q 13/20* (2013.01); *H01Q 13/22* (2013.01); *H04B 1/04* (2013.01); *H04B 1/0458* (2013.01); *H04B 5/0031* (2013.01); *H04B 7/24* (2013.01); *H01Q 15/006* (2013.01); *Y10T 307/25* (2015.04)

(58) Field of Classification Search
CPC ................................ H01Q 1/2283; H04B 7/24
USPC .................................................. 343/772, 745
See application file for complete search history.

(56) References Cited

U.S. PATENT DOCUMENTS

| | | |
|---|---|---|
| 4,701,763 A | 10/1987 | Yamamoto |
| 5,138,436 A | 8/1992 | Koepf |

(Continued)

OTHER PUBLICATIONS

Ourir, A.; Burokur, S.N.; de Lustrac, A.; , "Electronically reconfigurable metamaterial for compact directive cavity antennas," Electronics Letters , vol. 43, No. 13, pp. 698-700, Jun. 21, 2007.*

(Continued)

*Primary Examiner* — Sue A Purvis
*Assistant Examiner* — Amal Patel
(74) *Attorney, Agent, or Firm* — Oblon, McClelland, Maier & Neustadt, L.L.P.

(57) ABSTRACT

Methods and systems for dynamic control of output power of a leaky wave antenna (LWA) are disclosed and may include configuring one or more LWAs in a wireless device to transmit RF signals at a desired frequency. The LWAs may be integrated in support structures, including an integrated circuit, an integrated circuit package, and/or a printed circuit board. Impedances that are coupled to the LWAs and to a power amplifier enabled to amplify the RF signals may be dynamically configured. A resonant frequency of the LWAs may be tuned, which may be configured to transmit the RF signals at a desired angle from a surface of the support structure. The LWAs may include microstrip or coplanar waveguides where a cavity height of the LWAs may be configured by controlling spacing between conductive lines in the waveguides. The impedances may include capacitor arrays and/or inductors in the support structures.

20 Claims, 10 Drawing Sheets

(51) Int. Cl.
  *H01Q 13/22* (2006.01)
  *H04B 1/04* (2006.01)
  *H04B 5/00* (2006.01)
  *H04B 7/24* (2006.01)
  *G06K 7/10* (2006.01)
  *H01Q 15/00* (2006.01)

(56) References Cited

U.S. PATENT DOCUMENTS

| | | | |
|---|---|---|---|
| 5,300,875 A | 4/1994 | Tuttle | |
| 5,363,075 A | 11/1994 | Fanucchi | |
| 5,387,885 A | 2/1995 | Chi | |
| 5,717,943 A | 2/1998 | Barker | |
| 5,900,843 A | 5/1999 | Lee | |
| 5,912,598 A | 6/1999 | Stones | |
| 6,005,520 A | 12/1999 | Nalbandian | |
| 6,037,743 A | 3/2000 | White | |
| 6,127,799 A | 10/2000 | Krishnan | |
| 6,212,431 B1 | 4/2001 | Hahn | |
| 6,285,325 B1 | 9/2001 | Nalbandian | |
| 6,597,323 B2 | 7/2003 | Teshirogi | |
| 6,603,915 B2 | 8/2003 | Glebov | |
| 6,735,630 B1 | 5/2004 | Gelvin | |
| 6,771,935 B1 | 8/2004 | Leggett | |
| 6,841,981 B2 | 1/2005 | Smith | |
| 6,954,236 B1 | 10/2005 | Russell | |
| 7,002,517 B2 | 2/2006 | Noujeim | |
| 7,020,701 B1 | 3/2006 | Gelvin | |
| 7,023,374 B2 | 4/2006 | Jossef | |
| 7,084,823 B2 | 8/2006 | Caimi | |
| 7,242,368 B2 * | 7/2007 | Thevenot et al. | 343/909 |
| 7,253,780 B2 | 8/2007 | Sievenpiper | |
| 7,268,517 B2 | 9/2007 | Rahmel | |
| 7,317,342 B2 | 1/2008 | Saint-Laurent | |
| 7,330,090 B2 | 2/2008 | Itoh | |
| 7,348,928 B2 | 3/2008 | Ma | |
| 7,373,133 B2 | 5/2008 | Mickle | |
| 7,394,288 B1 | 7/2008 | Agarwal | |
| 7,535,958 B2 | 5/2009 | Best | |
| 7,592,957 B2 | 9/2009 | Achour | |
| 7,620,424 B2 | 11/2009 | Cetiner | |
| 7,733,265 B2 | 6/2010 | Margomenos | |
| 7,855,696 B2 | 12/2010 | Gummalla | |
| 8,195,103 B2 | 6/2012 | Waheed | |
| 8,242,957 B2 * | 8/2012 | Rofougaran et al. | 342/432 |
| 8,285,231 B2 * | 10/2012 | Rofougaran et al. | 455/129 |
| 8,295,788 B2 | 10/2012 | Rofougaran | |
| 8,299,971 B2 | 10/2012 | Talty | |
| 2002/0000936 A1 | 1/2002 | Sheen | |
| 2002/0005807 A1 | 1/2002 | Sheen | |
| 2002/0041256 A1 | 4/2002 | Saitou | |
| 2002/0135568 A1 | 9/2002 | Chen | |
| 2003/0122729 A1 | 7/2003 | Diaz | |
| 2004/0066251 A1 | 4/2004 | Eleftheriades | |
| 2004/0203944 A1 | 10/2004 | Huomo | |
| 2004/0227668 A1 | 11/2004 | Sievenpiper | |
| 2004/0263378 A1 | 12/2004 | Jossef | |
| 2004/0263408 A1 | 12/2004 | Sievenpiper | |
| 2005/0012667 A1 | 1/2005 | Noujeim | |
| 2005/0052424 A1 | 3/2005 | Shih | |
| 2005/0116864 A1 | 6/2005 | Mohamadi | |
| 2005/0134579 A1 | 6/2005 | Hsieh | |
| 2005/0136972 A1 | 6/2005 | Smith | |
| 2006/0066326 A1 | 3/2006 | Slupsky | |
| 2006/0109127 A1 | 5/2006 | Barink | |
| 2006/0125703 A1 | 6/2006 | Ma | |
| 2006/0281423 A1 * | 12/2006 | Caimi et al. | 455/129 |
| 2007/0171076 A1 | 7/2007 | Stevens | |
| 2007/0190952 A1 | 8/2007 | Waheed | |
| 2007/0273607 A1 | 11/2007 | Chen | |
| 2007/0285248 A1 | 12/2007 | Hamel | |
| 2007/0287403 A1 | 12/2007 | Sjoland | |
| 2008/0068174 A1 | 3/2008 | Al-Mahdawi | |
| 2008/0105966 A1 | 5/2008 | Beer | |
| 2008/0159243 A1 | 7/2008 | Rofougaran | |
| 2008/0231603 A1 | 9/2008 | Parkinson | |
| 2008/0258981 A1 | 10/2008 | Achour | |
| 2008/0278400 A1 | 11/2008 | Lohninger | |
| 2008/0284085 A1 | 11/2008 | Curina | |
| 2008/0316135 A1 | 12/2008 | Hilgers | |
| 2009/0108996 A1 | 4/2009 | Day | |
| 2009/0160612 A1 | 6/2009 | Varpula | |
| 2009/0251362 A1 | 10/2009 | Margomenos | |
| 2010/0110943 A2 | 5/2010 | Gummalla | |
| 2010/0222105 A1 | 9/2010 | Nghiem | |
| 2010/0308668 A1 * | 12/2010 | Rofougaran et al. | 307/149 |
| 2010/0308767 A1 * | 12/2010 | Rofougaran et al. | 320/108 |
| 2010/0308885 A1 * | 12/2010 | Rofougaran et al. | 327/297 |
| 2010/0308970 A1 * | 12/2010 | Rofougaran et al. | 340/10.1 |
| 2010/0308997 A1 * | 12/2010 | Rofougaran et al. | 340/572.7 |
| 2010/0309040 A1 * | 12/2010 | Rofougaran et al. | 342/104 |
| 2010/0309056 A1 * | 12/2010 | Rofougaran et al. | 342/417 |
| 2010/0309069 A1 * | 12/2010 | Rofougaran et al. | 343/745 |
| 2010/0309071 A1 * | 12/2010 | Rofougaran | 343/772 |
| 2010/0309072 A1 * | 12/2010 | Rofougaran | 343/772 |
| 2010/0309073 A1 * | 12/2010 | Rofougaran et al. | 343/772 |
| 2010/0309074 A1 * | 12/2010 | Rofougaran et al. | 343/772 |
| 2010/0309075 A1 * | 12/2010 | Rofougaran et al. | 343/772 |
| 2010/0309076 A1 * | 12/2010 | Rofougaran et al. | 343/772 |
| 2010/0309077 A1 * | 12/2010 | Rofougaran et al. | 343/776 |
| 2010/0309078 A1 * | 12/2010 | Rofougaran et al. | 343/776 |
| 2010/0309079 A1 * | 12/2010 | Rofougaran et al. | 343/777 |
| 2010/0309824 A1 * | 12/2010 | Rofougaran et al. | 370/277 |
| 2010/0311324 A1 * | 12/2010 | Rofougaran et al. | 455/39 |
| 2010/0311332 A1 * | 12/2010 | Roufougaran et al. | 455/41.2 |
| 2010/0311333 A1 * | 12/2010 | Rofougaran et al. | 455/41.2 |
| 2010/0311338 A1 * | 12/2010 | Rofougaran et al. | 455/41.3 |
| 2010/0311340 A1 * | 12/2010 | Rofougaran et al. | 455/42 |
| 2010/0311355 A1 * | 12/2010 | Rofougaran et al. | 455/91 |
| 2010/0311356 A1 * | 12/2010 | Rofougaran et al. | 455/91 |
| 2010/0311359 A1 * | 12/2010 | Rofougaran et al. | 455/110 |
| 2010/0311363 A1 * | 12/2010 | Rofougaran et al. | 455/121 |
| 2010/0311364 A1 * | 12/2010 | Rofougaran et al. | 455/127.1 |
| 2010/0311367 A1 * | 12/2010 | Rofougaran et al. | 455/129 |
| 2010/0311368 A1 * | 12/2010 | Rofougaran et al. | 455/129 |
| 2010/0311369 A1 * | 12/2010 | Rofougaran et al. | 455/129 |
| 2010/0311376 A1 * | 12/2010 | Rofougaran et al. | 455/269 |
| 2010/0311379 A1 * | 12/2010 | Rofougaran et al. | 455/307 |
| 2010/0311380 A1 * | 12/2010 | Rofougaran et al. | 455/307 |
| 2010/0311472 A1 * | 12/2010 | Rofougaran et al. | 455/572 |
| 2010/0311493 A1 | 12/2010 | Miller | |
| 2011/0163970 A1 * | 7/2011 | De Lustrac et al. | 343/777 |
| 2012/0095531 A1 | 4/2012 | Derbas | |
| 2012/0153731 A9 | 6/2012 | Kirby | |
| 2012/0263256 A1 | 10/2012 | Waheed | |

OTHER PUBLICATIONS

Sterner, M.; Chicherin, D.; Raisenen, A.V.; Stemme, G.; Oberhammer, J.; , "RF MEMS High-Impedance Tuneable Metamaterials for Millimeter-Wave Beam Steering," Micro Electro Mechanical Systems, 2009. MEMS 2009. IEEE 22nd International Conference on , vol., no., pp. 896-899, Jan. 25-29, 2009.*

O, K.K.; Kim, K.; Floyd, B.; Mehta, J.; Yoon, H.; Hung, C.-M.; Bravo, D.; Dickson, T.; Guo, X.; Li, R.; Trichy, N.; Caserta, J.; et al.;, "Silicon Integrated Circuits Incorporating Antennas," Custom Integrated Circuits Conference, 2006. CICC '06. IEEE , vol., no., pp. 473-480, Sep. 10-13, 2006.*

Grbic, A.; Eleftheriades, G.V.; , "Leaky CPW-based slot antenna arrays for millimeter-wave applications," Antennas and Propagation, IEEE Transactions on , vol. 50, No. 11, pp. 1494-1504, Nov. 2002.*

J. Yeo and D. Kim "Novel design of a high-gain and wideband Fabry-Perot cavity antenna using a tapered AMC substrate", Int. J. Infrared Milli. Waves, vol. 30, No. 3, Dec. 2008.*

Iyer et al., "Wireless chip to chip interconnections for multichip modules using leaky wave antennas", Nov. 1993, pp. 2030-2031.

Huang et al., "An Electronically Switchable Leaky Wave Antenna", Nov. 2000, pp. 1769-1772.

Grbic et al., "Leaky CPW-Based Slot Antenna Arrays for Millimeter-Wave Applications", Nov. 2002, pp. 1494-1504.

(56) References Cited

OTHER PUBLICATIONS

Floyd et al., "Wireless Interconnects for Clock Distribution", pp. 105-108.
Zvolensky et al., "Leaky-Wave antenna based on micro-electromechanical systems-loaded microstrip line", 2011, pp. 357-363.
Feresidis et al., "Flat Plate Millimetre Wave Antenna Based on Partially Reflective FSS", 11$^{th}$ International Conference on Antennas and Propagation, 2001, pp. 33-36.
O, K.K. et al., "Silicon Integrated Circuits Incorporating Antennas", IEEE Custom Integrated Circuits Conference, 2006, pp. 473-480.
Sterner et al., "RF MEMS High-Impedance Tuneable Metamaterials for Millimeter-Wave Beam Steering", Micro Electro Mechanical Systems, 2009, pp. 896-899.
Ourir et al., "Electronically Reconfigurable Metamaterial for Compact Directive Cavity Antennas", Electronics Letters, 2007.
Kimoto et al., "On-Chip Wireless Signal Transmission using Silicon Integrated Antennas", Measurement 40, No. 30, (2004): 20.

* cited by examiner

METHOD AND SYSTEM FOR DYNAMIC CONTROL OF OUTPUT POWER OF A LEAKY WAVE ANTENNA

CROSS-REFERENCE TO RELATED APPLICATIONS/INCORPORATION BY REFERENCE

This application makes reference to, claims the benefit from, and claims priority to U.S. Provisional Application Ser. No. 61/246,618 filed on Sep. 29, 2009, and U.S. Provisional Application Ser. No. 61/185,245 filed on Jun. 9, 2009.

This application also makes reference to:
U.S. patent application Ser. No. 12/650,212 filed on Dec. 30, 2009;
U.S. patent application Ser. No. 12/650,295 filed on Dec. 30, 2009;
U.S. patent application Ser. No. 12/650,277 filed on Dec. 30, 2009;
U.S. patent application Ser. No. 12/650,192 filed on Dec. 30, 2009;
U.S. patent application Ser. No. 12/650,224 filed on Dec. 30, 2009;
U.S. patent application Ser. No. 12/650,176 filed on Dec. 30, 2009;
U.S. patent application Ser. No. 12/650,246 filed on Dec. 30, 2009;
U.S. patent application Ser. No. 12/650,292 filed on Dec. 30, 2009;
U.S. patent application Ser. No. 12/650,324 filed on Dec. 30, 2009;
U.S. patent application Ser. No. 12/708,366 filed on Feb. 18, 2010;
U.S. patent application Ser. No. 12/751,751 filed on even date herewith;
U.S. patent application Ser. No. 12/751,550 filed on even date herewith;
U.S. patent application Ser. No. 12/751,768 filed on even date herewith;
U.S. patent application Ser. No. 12/751,759 filed on even date herewith;
U.S. patent application Ser. No. 12/751,593 filed on even date herewith;
U.S. patent application Ser. No. 12/751,772 filed on even date herewith;
U.S. patent application Ser. No. 12/751,782 filed on even date herewith; and
U.S. patent application Ser. No. 12/751,792 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for dynamic control of output power of a leaky wave antenna.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for dynamic control of output power of a leaky wave antenna as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for dynamic control of output power of a leaky wave antenna. Exemplary aspects of the invention may comprise configuring one or more leaky wave antennas in a wireless device to transmit RF signals at a desired frequency. The leaky wave antennas may be integrated in one or more support structures. The support structures may comprise one or more of: an integrated circuit, an integrated circuit package, and a printed circuit board. One or more impedances that are coupled to the one or more enabled leaky wave antennas and to a power amplifier enabled to amplify the RF signals may be dynamically configured. A resonant frequency of the one or more enabled leaky wave antennas may be tuned. The one or more enabled leaky wave antennas may be configured to transmit the RF signals at a desired angle from a surface of the support structure. The RF signals may be communicated between regions within the support structures. The one or more leaky wave antennas may comprise microstrip waveguides where a cavity height of the one or more leaky wave antennas may be configured by controlling spacing between conductive lines in the microstrip waveguides. The one or more leaky wave antennas comprise coplanar waveguides where a cavity height of the one or more leaky wave antennas may be configured by controlling spacing between conductive lines in the coplanar waveguides. The one or more impedances may comprise capacitor arrays and/or inductors in the one or more support structures.

Figure 1:
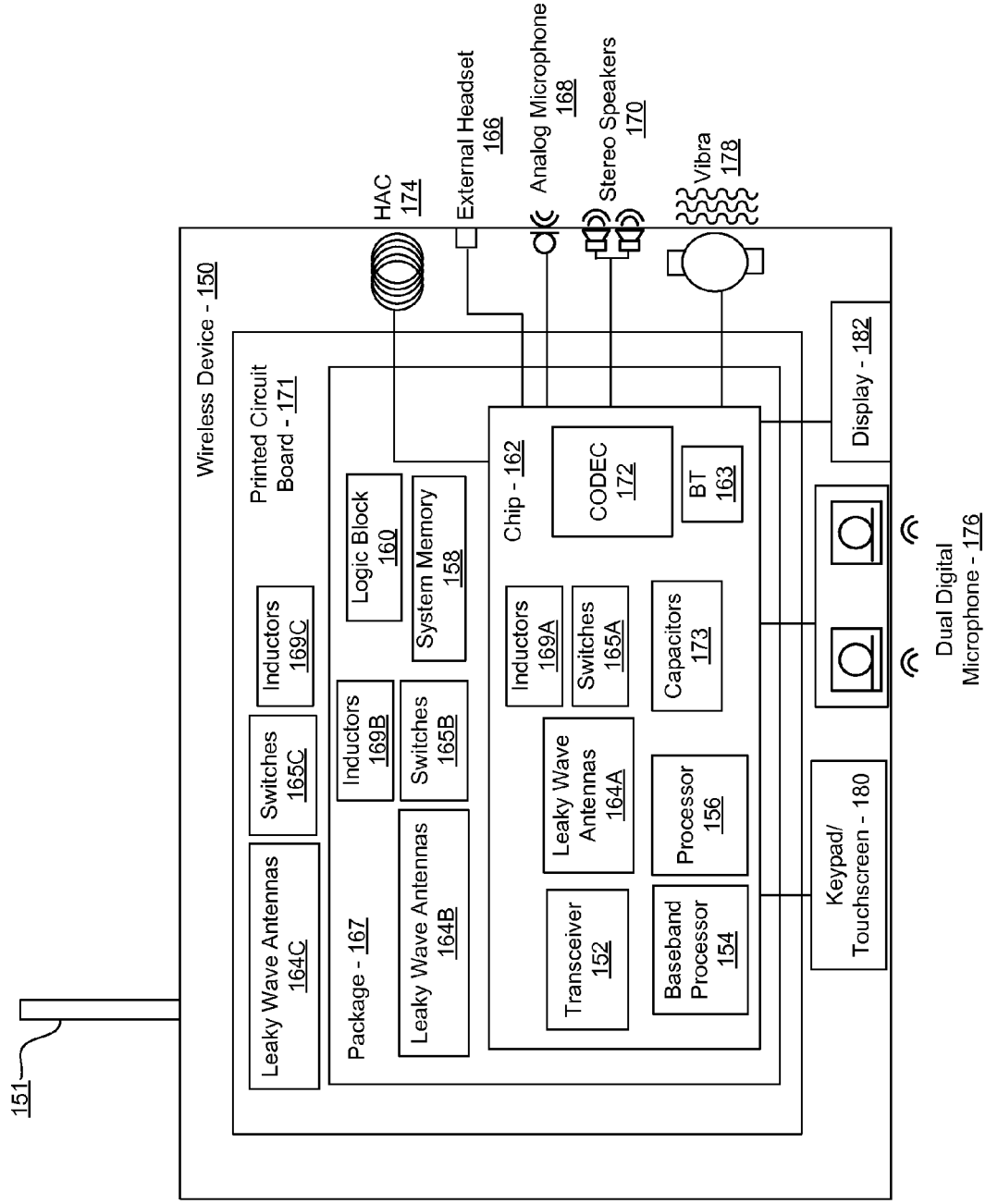
FIG. 1 is a block diagram of an exemplary wireless system with leaky wave antennas and matching inductors, which may be utilized in accordance with an embodiment of the invention.

FIG. 1 is a block diagram of an exemplary wireless system with leaky wave antennas and matching inductors, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A-164C, switches 165A-165C, an external headset port 166, and a package 167. The wireless device 150 may also comprise an analog microphone 168, inductors 169A-169C, integrated hands-free (IHF) stereo speakers 170, a printed circuit board 171, capacitors 173, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A-164C. Different wireless systems may use different antennas for transmission and reception. The transceiver 152 may be enabled to execute other functions, for example, filtering the baseband and/or RF signals, and/or amplifying the baseband and/or RF signals. For example, the transceiver 152 may comprise a plurality of power amplifiers (PAs) and/or low-noise amplifiers (LNAs) for amplifying RF signals. The gain of the PAs and/or LNAs may be configurable to enable a desired transmitted and/or received signal strength, respectively.

Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZigBee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, and the CODEC 172. The number of functional blocks integrated in the chip 162 is not limited to the number shown in FIG. 1. Accordingly, any number of blocks may be integrated on the chip 162 depending on chip space and wireless device 150 requirements, for example. The chip 162 may be flip-chip bonded, for example, to the package 167, as described further with respect to FIG. 8B.

The leaky wave antennas 164A-164C may comprise a resonant cavity with a highly reflective surface and a lower reflectivity surface, and may be integrated in and/or on the chip 162, the package 167, and/or the printed circuit board 171. The lower reflectivity surface may allow the resonant mode to "leak" out of the cavity. The lower reflectivity surface of the leaky wave antennas 164A-164C may be configured with slots in a metal surface, or a pattern of metal patches, as described further in FIGS. 2 and 3. The physical dimensions of the leaky wave antennas 164A-164C may be configured to optimize bandwidth of transmission and/or the beam pattern radiated.

In an exemplary embodiment of the invention, the leaky wave antennas 164A-164C may comprise a plurality of leaky wave antennas integrated in and/or on the chip 162, the package 167, and/or printed circuit board 171. The leaky wave antennas 164A-164C may be operable to transmit and/or receive wireless signals at or near 60 GHz, for example, due to the cavity length of the devices being on the order of millimeters. The leaky wave antennas 164A-164C may be configured to transmit in different directions, including in the lateral direction parallel to the surface of the chip 162, the package 167, and/or the printed circuit board 171, thereby enabling communication between regions of the chip 162, the package 167, and/or the printed circuit board 171.

Figure 3:
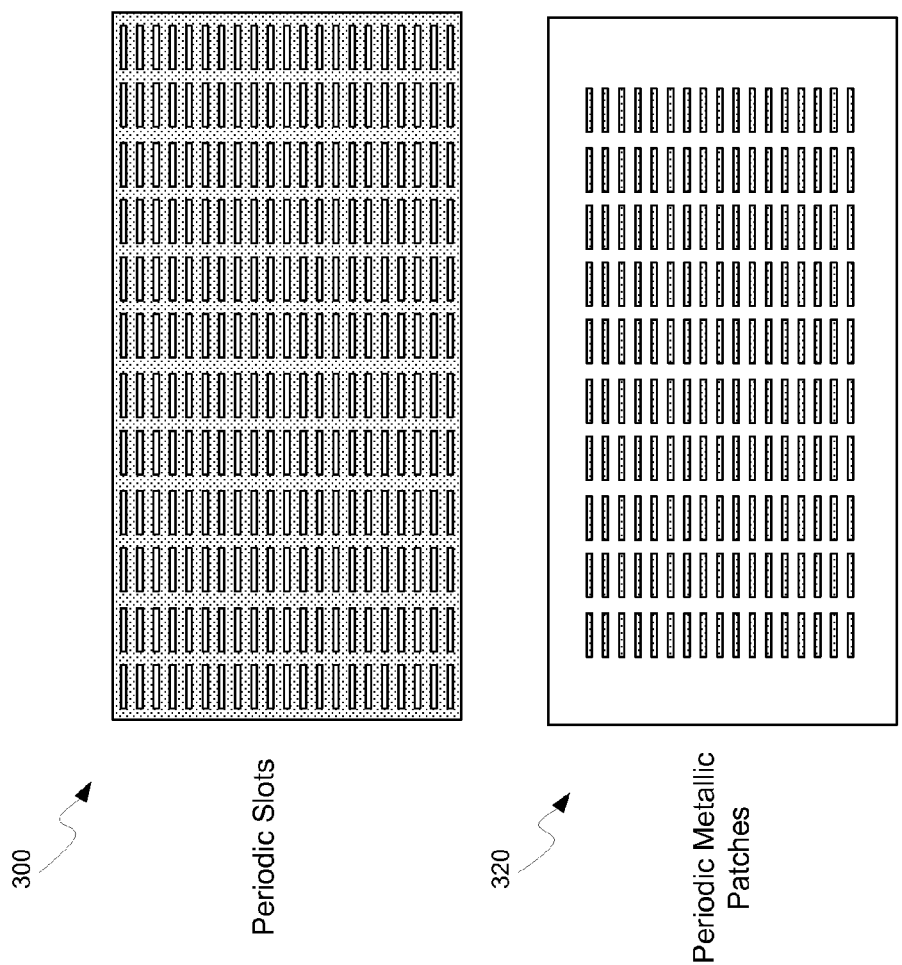
FIG. 3 is a block diagram illustrating a plan view of exemplary partially reflective surfaces for a leaky wave antenna, in accordance with an embodiment of the invention.

The switches 165A-165C may comprise switches such as CMOS or MEMS switches that may be operable to switch different antennas of the leaky wave antennas 164A-164C to the transceiver 152 and/or to switch elements in and/or out of the circuit comprising the leaky wave antennas 164A-164C, such as the inductors 169A-169C and/or the patches and slots described in FIG. 3. In another embodiment of the invention, the switches 165A-165C may comprise MEMS devices that may enable MEMS actuation of reflective surfaces in the leaky wave antennas 164A-164C. Accordingly, the resonant frequency and/or the angle of transmission and/or reception may be configured for the leaky wave antennas 164A-164C.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The printed circuit board 171 may comprise an essentially electrically insulating material with conductive traces integrated within and/or on the surface for the interconnection of devices affixed to the printed circuit board 171. For example, the package 167 may be affixed to the printed circuit board 171 utilizing flip-chip bonding. In addition, the leaky wave antennas 164C and the switches 165C may be integrated in and/or on the printed circuit board 171 to enable communication of RF signals between the printed circuit board 171 and devices in the chip 162 and the package 167. The number of devices on the printed circuit board 171 is not limited to the number shown in FIG. 1. Accordingly, any number of chips, packages, and other devices may be integrated, depending on space requirements and desired functionality.

The inductors 169A-169C may comprise inductive structures integrated in the chip 162, the package 167, and the printed circuit board 171, respectively. The inductors 169A-169C may be operable to enable resonant frequency matching between PAs and/or LNAs in the transceiver 152 and the leaky wave antennas 164A-164C, thereby mitigating impedance changes in the antennas, for example. In this manner, the output power transmission and/or reception efficiency of the leaky wave antennas 164A-164C may be increased.

The stereo speakers 170 may comprise a pair of speakers that may be operable to generate audio signals from electrical signals received from the CODEC 172. The HAG coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The capacitors 173 may comprise an array of capacitors on the chip 162 that may be utilized with the inductors 169A-169C for resonant frequency tuning of the leaky wave antennas 164A-164C when coupled to PAs and/or LNAs. The capacitors 173 may comprise CMOS capacitors, for example, and may be configurable by the processor 156 and/or the baseband processor 154.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The leaky wave antennas 164A-164C may be operable to transmit and/or receive wireless signals between the chip 162 and devices external to the wireless device via antennas in the chip, package, and/or printed circuit board. Resonant cavities may be configured between reflective surfaces in and/or on the chip 162, the package 167, and/or the printed circuit board 171 so that signals may be transmitted and/or received from any location without requiring large areas needed for conventional antennas and associated circuitry. Coplanar waveguide structures may be utilized to enable the communication of signals in the horizontal direction within the chip 162, the package 167, and/or the printed circuit board 171.

High frequency signals may be communicated to the leaky wave antennas 164C from devices in the chip 162 and/or the package 167 for communication to devices on other printed circuit boards and/or to devices external to the wireless device 150. The signals may be communicated to the leaky wave antennas 164C via other leaky wave antennas, such as the leaky wave antennas 164A and/or 164B.

The cavity height of the leaky wave antennas 164A-164C may be configured to control the frequency of the signals that may be transmitted and/or received. Accordingly, the reflective surfaces may be controlled to provide different heights in the chip 162, the package 167, and/or the printed circuit board 171, thereby configuring leaky wave antennas with different resonant frequencies.

The leaky wave antennas 164A may be operable to transmit and/or receive signals to and from the chip 162. In this manner, high frequency traces to an external antenna, such as the leaky wave antennas 164C, may be reduced and/or eliminated for higher frequency signals.

Different frequency signals may be transmitted and/or received by the leaky wave antennas 164A-164C by selectively coupling the transceiver 152 to leaky wave antennas with different cavity heights. For example, a leaky wave antenna with reflective surfaces on the top and the bottom of the printed circuit board 171 may have the largest cavity height, and thus provide the lowest resonant frequency. Conversely, a leaky wave antenna with both reflective surfaces in the same plane of the chip 162, as in a coplanar waveguide configuration, for example, may provide a higher resonant frequency.

In an embodiment of the invention, the capacitors 173 in the chip 162 and the inductors 169A-169C may be electrically coupled between the leaky wave antennas 164A-164C and PAs and/or LNAs in the transceiver 152. The configuration enables active tuning of impedances to match transmitted frequencies with the resonant frequencies of the leaky wave antennas 164A-164C. The frequency of the signal to be transmitted may be dynamically tuned to match that of the leaky wave antennas 164A-164C, and/or the leaky wave antennas 164A-164C may be dynamically tuned via MEMS deflection, for example, thereby tuning the resonant frequency of the LWAs 164A-164C.

Figure 2:
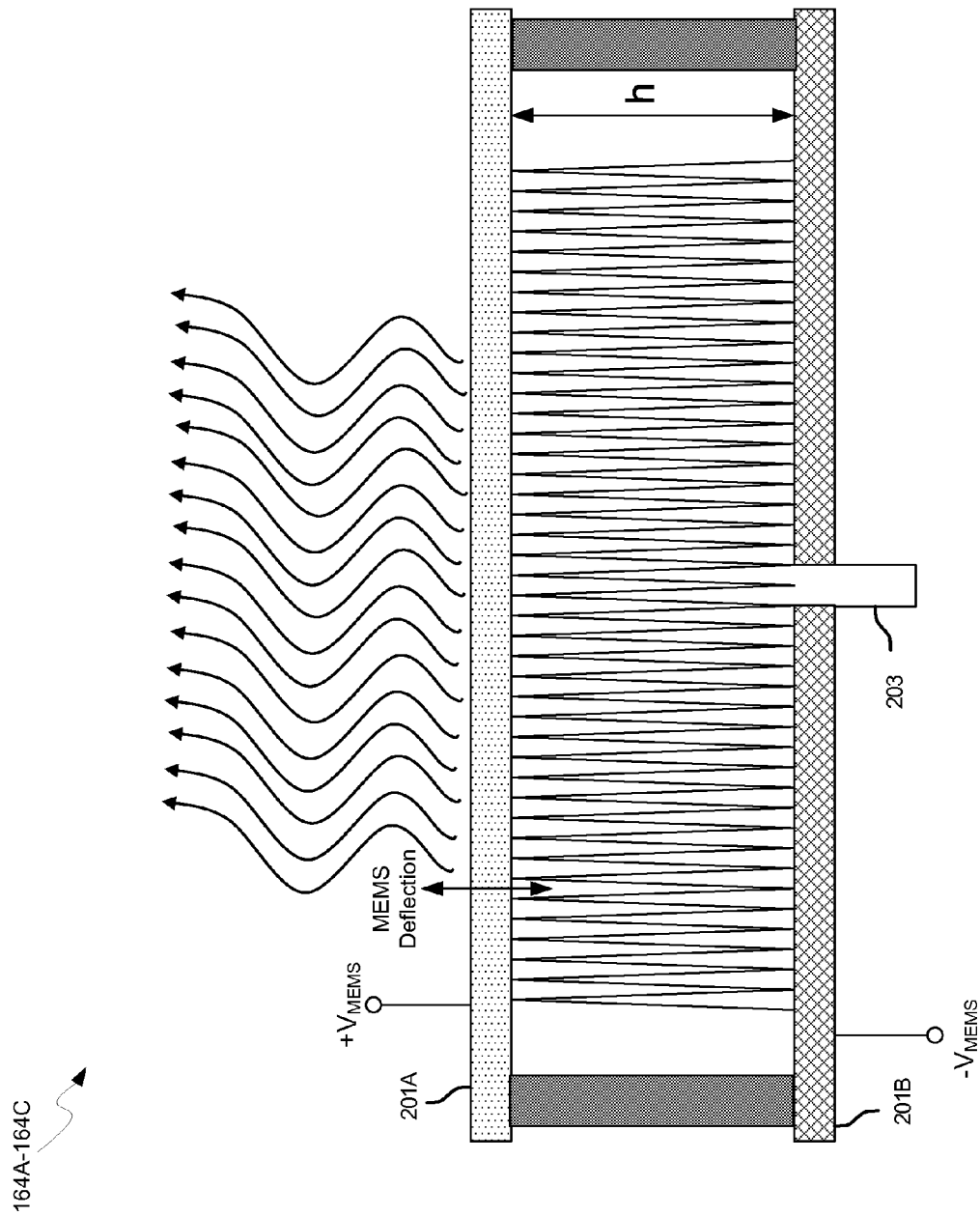
FIG. 2 is a block diagram illustrating an exemplary leaky wave antenna, in accordance with an embodiment of the invention.

FIG. 2 is a block diagram illustrating an exemplary leaky wave antenna, in accordance with an embodiment of the invention. Referring to FIG. 2, there is shown the leaky wave antennas 164A-164C comprising a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of transmission of the leaky wave antennas 164A-164C. In another embodiment of the invention, an air gap may be integrated in the space between the partially reflective surface 201A and the reflective surface 201B to enable MEMS actuation. There is also shown (micro-electromechanical systems) MEMS bias voltages, $+V_{MEMS}$ and $-V_{MEMS}$.

The feed point 203 may comprise an input terminal for applying an input voltage to the leaky wave antennas 164A-164C. The invention is not limited to a single feed point 203, as there may be any amount of feed points for different phases of signal or a plurality of signal sources, for example, to be applied to the leaky wave antennas 164A-164C.

In an embodiment of the invention, the height, h, may be one-half the wavelength of the desired transmitted mode from the leaky wave antennas 164A-164C. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antennas 164. The input impedance of the leaky wave antennas 164A-164C may be configured by the vertical placement of the feed point 203, as described further in FIG. 6.

In operation, a signal to be transmitted via a power amplifier in the transceiver 152 may be communicated to the feed point 203 of the leaky wave antennas 164A-164C with a frequency f. The cavity height, h, may be configured to correlate to one half the wavelength of a harmonic of the signal of frequency f. The signal may traverse the height of the cavity and may be reflected by the partially reflective surface 201A, and then traverse the height back to the reflective surface 201B. Since the wave will have traveled a distance corresponding to a full wavelength, constructive interference may result and a resonant mode may thereby be established.

Leaky wave antennas may enable the configuration of high gain antennas without the need for a large array of antennas which require a complex feed network and suffer from loss due to feed lines. The leaky wave antennas 164A-164C may be operable to transmit and/or receive wireless signals via conductive layers in and/or on chip 162, the package 167, and the printed circuit board 171. In this manner, the resonant frequency of the cavity may cover a wider range due to the larger size of the printed circuit board 171 and the package 167, compared to the chip 162, without requiring large areas needed for conventional antennas and associated circuitry.

In an exemplary embodiment of the invention, the frequency of transmission and/or reception of the leaky wave antennas 164A-164C may be configured by selecting one of the leaky wave antennas 164A-164C with the appropriate cavity height for the desired frequency. Leaky wave antennas integrated on the chip 162, the package 167, and/or the printed circuit board 171 may comprise coplanar waveguide structures, either on a surface and/or integrated within the chip 162, such that wireless signals may be communicated in a horizontal direction, enabling wireless communication between regions of the chip 162. Additionally, leaky wave antennas may be integrated with the direction of the leaked signal coming out of the surface of the chip 162, the package 167, and/or the printed circuit board 171, thereby enabling communication between the chip 162 and external devices on the package 167, the printed circuit board 171, and/or other external devices.

In another embodiment of the invention, the cavity height, h, may be configured by MEMS actuation. For example, the bias voltages $+V_{MEMS}$ and $-V_{MEMS}$ may deflect one or both of the reflective surfaces 201A and 201B compared to zero bias, thereby configuring the resonant frequency of the cavity. Power transmission efficiency may be increased by varying the cavity height, h, of the resonant cavity, and thus the resonant frequency, to match that of the signal to be transmitted.

FIG. 3 is a block diagram illustrating a plan view of exemplary partially reflective surfaces for a leaky wave antenna, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

In an embodiment of the invention, the slots/patches may be configured via CMOS and/or micro-electromechanical system (MEMS) switches, such as the switches 165 described with respect to FIG. 1, to tune the Q of the resonant cavity. The slots and/or patches may be configured in conductive layers in and/or on the chip 162 and may be shorted together or switched open utilizing the switches 165. In this manner, RF signals, such as 60 GHz signals, for example, may be transmitted from various locations in the chip 162, the package 167, and/or the printed circuit board 171 without the need for additional circuitry and conventional antennas with their associated circuitry that require valuable space.

In another embodiment of the invention, the slots or patches may be configured in conductive layers in a vertical plane of the chip 162, the package 167, and/or the printed circuit board 171, thereby enabling the communication of wireless signals in a horizontal direction in the chip 162, the package 167, and/or the printed circuit board 171. For example, grids of alternating conductive and insulating material may be integrated in a vertical plane, perpendicular to the surface, thereby enabling the horizontal transmission of RF signals.

Figure 4:
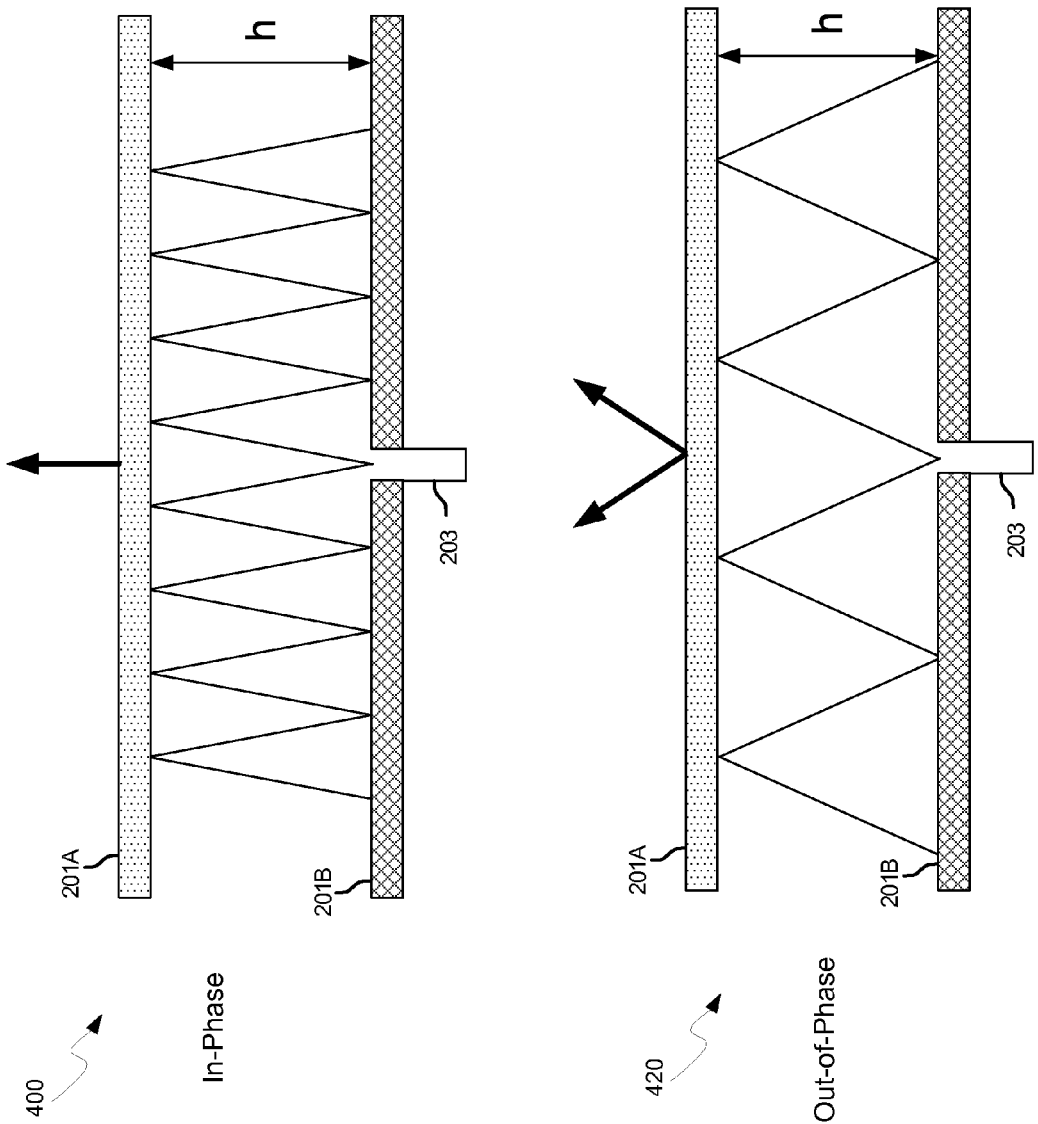
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partially reflective surface 201A, the reflective surface 201B, and the feed point 203. In-phase condition 400 illustrates the relative beam shape transmitted by the leaky wave antennas 164A-164C when the frequency of the signal communicated to the feed point 203 matches that of the resonant cavity as defined by the cavity height, h, and the dielectric constant of the material between the reflective surfaces.

Similarly, out-of-phase condition 420 illustrates the relative beam shape transmitted by the leaky wave antenna 164A-164C when the frequency of the signal communicated to the feed point 203 does not match that of the resonant cavity. The resulting beam shape may be conical, as opposed to a single main vertical node. These are illustrated further with respect to FIG. 5. The leaky wave antennas 164A-164C may be integrated at various heights in the chip 162, the package 167, and the printed circuit board 171, thereby providing a plurality of transmission and reception sites in the chip 162, the package 167, and/or the printed circuit board 171 with varying resonant frequency. In addition, a coplanar structure may be utilized to configure leaky wave antennas in the chip 162, the package 167, and/or the printed circuit board 171, thereby enabling communication of wireless signals in the horizontal plane of the structure.

By configuring the leaky wave antennas 164A-164C for in-phase and out-of-phase conditions, signals possessing different characteristics may be directed out of the chip 162, the package 167, and/or printed circuit board 171 in desired directions. In an exemplary embodiment of the invention, the angle at which signals may be transmitted by a leaky wave antenna may be dynamically controlled so that signal may be directed to desired receiving leaky wave antennas. In another embodiment of the invention, the leaky wave antennas 164A-164C may be operable to receive RF signals, such as 60 GHz signals, for example. The direction in which the signals are received may be configured by the in-phase and out-of-phase conditions.

Figure 5:
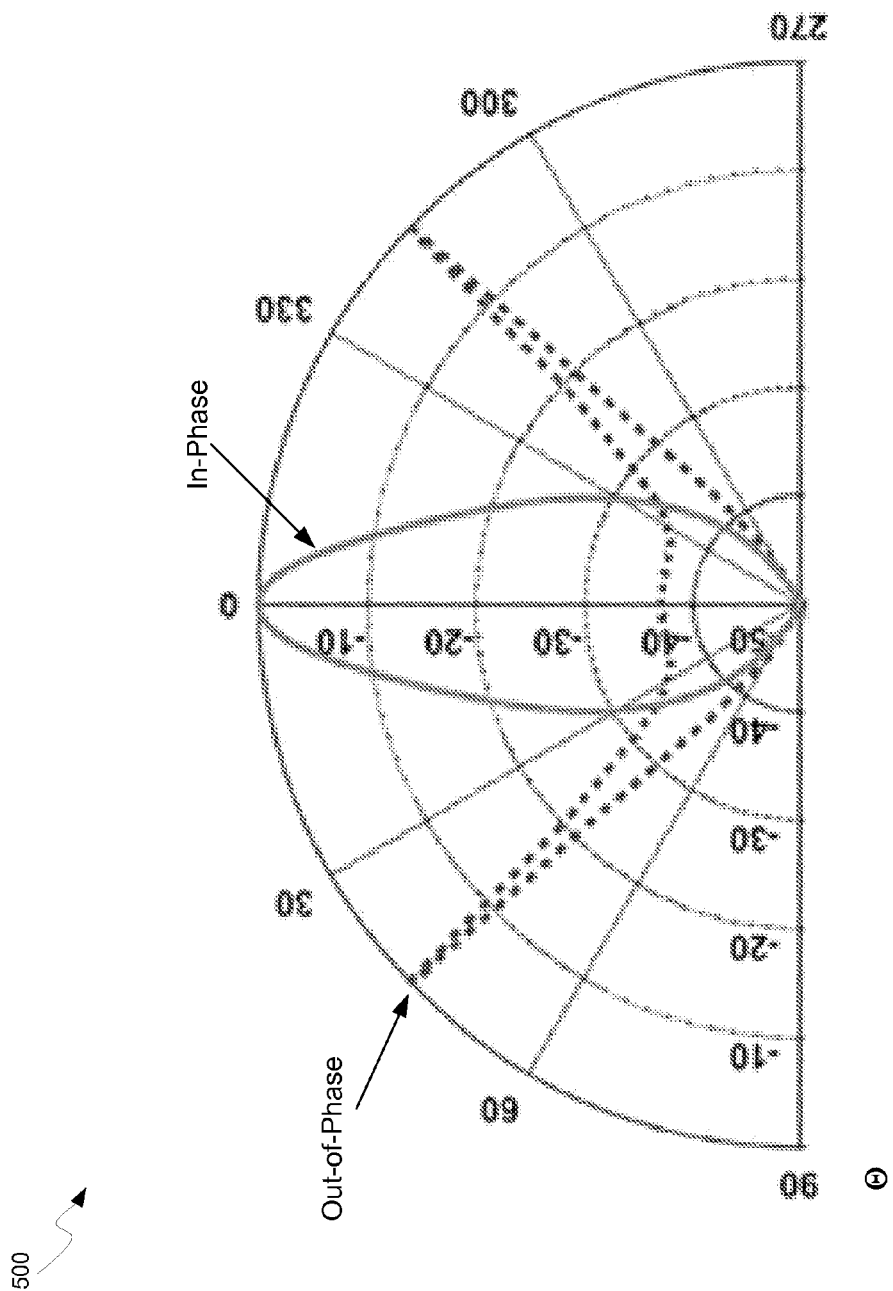
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle, $\Theta$, for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500. By configuring the leaky wave antennas for in-phase and out-of-phase conditions, signals may be directed out of the chip 162, the package 167, and/or the printed circuit board 171 in desired directions.

In another embodiment of the invention, the leaky wave antennas 164A-164C may be operable to receive wireless signals, and may be configured to receive from a desired direction via the in-phase and out-of-phase configurations.

Figure 6:
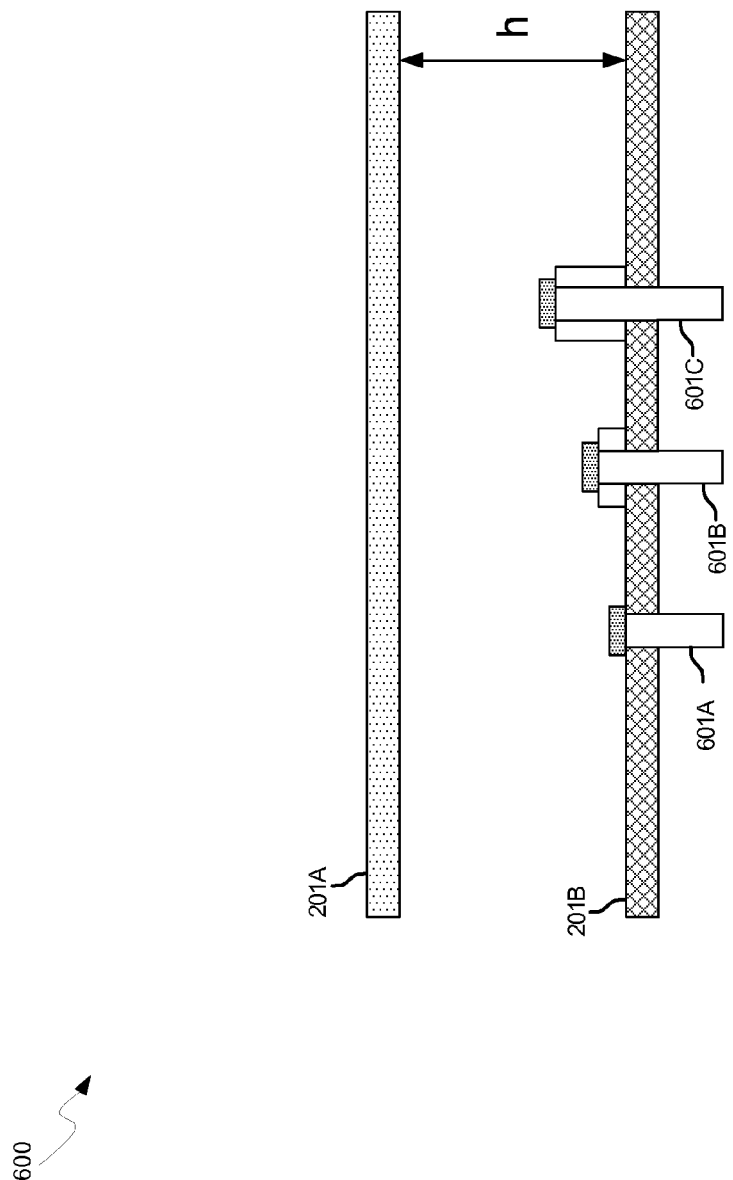
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height, h, of the cavity thereby configuring different impedance points for the leaky wave antenna. An air gap may be located below the conductive feed point in the cavity, thereby enabling MEMS deflection, similar to that for the leaky wave antennas 164A-164C as shown in FIG. 2.

In this manner, a leaky wave antenna may be utilized to couple to a plurality of power amplifiers, low-noise amplifiers, and/or other circuitry with varying output or input impedances. Similarly, by integrating leaky wave antennas in conductive layers in the chip 162, the package 167, and/or the printed circuit board 171, the impedance of the leaky wave antenna may be matched to the power amplifier or low-noise amplifier without impedance variations that may result with conventional antennas and their proximity or distance to associated driver electronics. Similarly, by integrating reflective and partially reflective surfaces with varying cavity heights and varying feed points, leaky wave antennas with different impedances and resonant frequencies may be enabled.

In an embodiment of the invention, different feed points 601A-601C may be utilized depending on the impedance of the PA and/or LNA coupled to the leaky wave antenna 600. In addition, the impedance of the feed points 601A-601C may be tuned via MEMS deflection, thereby enabling another method to control impedance and resonant frequency matching, thereby increasing transmitted and/or received power efficiency.

Figure 7:
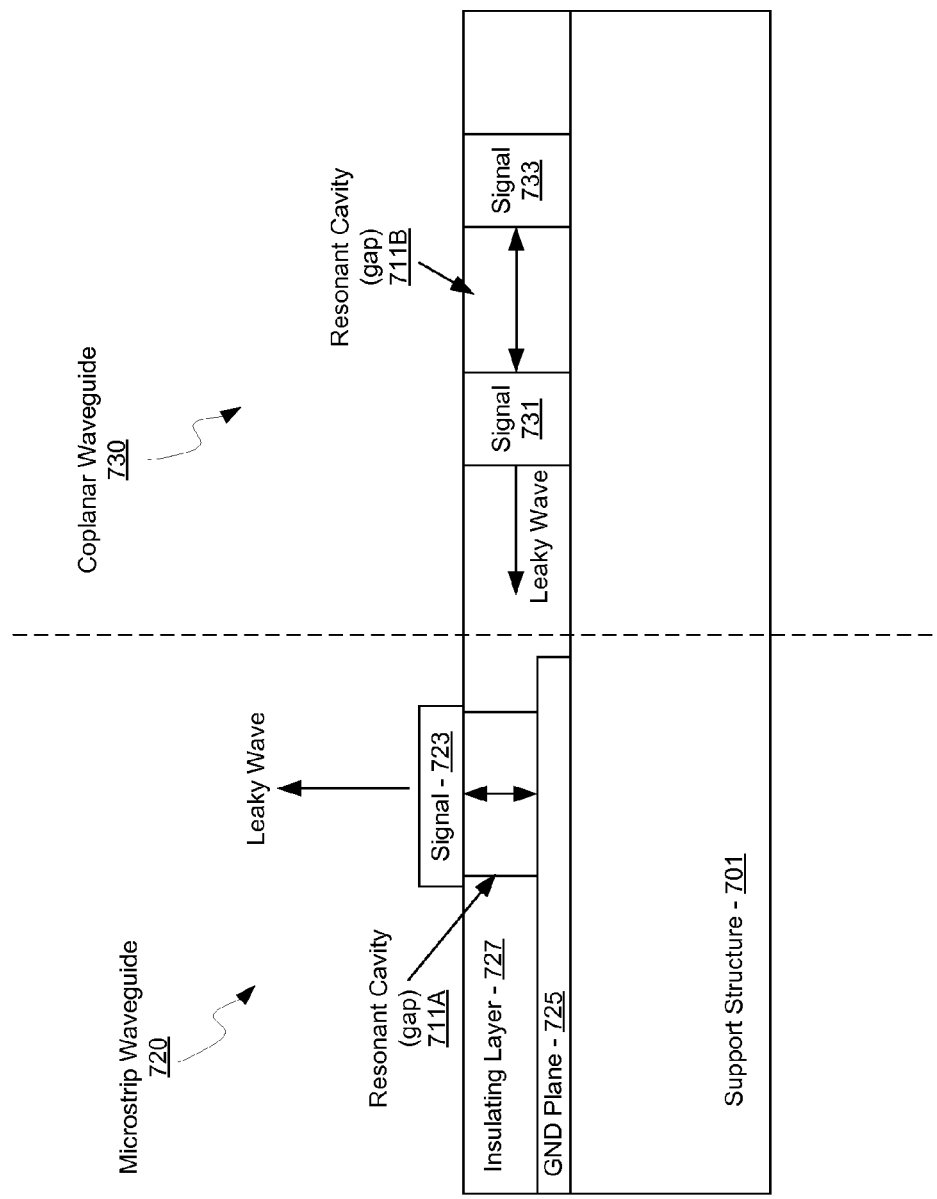
FIG. 7 is a block diagram illustrating a cross-sectional view of coplanar and microstrip waveguides, in accordance with an embodiment of the invention.

FIG. 7 is a block diagram illustrating a cross-sectional view of coplanar and microstrip waveguides, in accordance with an embodiment of the invention. Referring to FIG. 7, there is shown a microstrip waveguide 720 and a coplanar waveguide 730. The microstrip waveguide 720 may comprise signal conductive lines 723, a ground plane 725, a gap 711A, an insulating layer 727 and a substrate 729. The coplanar waveguide 730 may comprise signal conductive lines 731 and 733, a gap 711B, the insulating layer 727, and the support structure 701. The support structure 701 may comprise the chip 162, the package 167, and/or the printed circuit board 171.

The signal conductive lines 723, 731, and 733 may comprise metal traces or layers deposited in and/or on the insulating layer 727. In another embodiment of the invention, the signal conductive lines 723, 731, and 733 may comprise poly-silicon or other conductive material. The separation and the voltage potential between the signal conductive line 723 and the ground plane 725 may determine the electric field generated therein. In addition, the dielectric constant of the insulating layer 727 and the air gap 711A may also determine the electric field between the signal conductive line 723 and the ground plane 725.

The insulating layer 727 may comprise $SiO_2$ or other insulating material that may provide a high resistance layer between the signal conductive line 723 and the ground plane 725, and the signal conductive lines 731 and 733. In addition, the electric field between the signal conductive line 723 and the ground plane 725 may be dependent on the dielectric constant of the insulating layer 727.

The thickness and the dielectric constant of the insulating layer 727 may determine the electric field strength generated by the applied signal. The resonant cavity thickness of a leaky wave antenna may be dependent on the spacing between the signal conductive line 723 and the ground plane 725, or the signal conductive lines 731 and 733, for example. In an exemplary embodiment of the invention, the insulating layer 727 may be removed in localized regions in the microstrip waveguide 720 and the coplanar waveguide 730 to configure the gaps 711A and 711B, thereby allowing for MEMS deflection of the conductive layers and configuring of the height of the resonant cavity. The insulating layer 727 may be partially removed between the signal conductive line 723 and the ground plane 725 and/or the signal conductive lines 731 and 733, or completely removed, for example.

The signal conductive lines 731 and 733, and the signal conductive line 723 and the ground plane 725 may define resonant cavities for leaky wave antennas. Each layer may comprise a reflective surface or a partially reflective surface depending on the pattern of conductive material. For example, a partially reflective surface may be configured by alternating conductive and insulating material in a 1-dimensional or 2-dimensional pattern. In this manner, signals may be directed out of, or received into, a surface of the support structure 701, as illustrated with the microstrip waveguide 720. In another embodiment of the invention, signals may be communicated in the horizontal plane of the support structure 701 utilizing the coplanar waveguide 730.

The support structure 701 may provide mechanical support for the microstrip waveguide 720, the coplanar waveguide 730, and other devices that may be integrated within. In another embodiment of the invention, the support structure 701 may comprise Si, GaAs, sapphire, InP, GaO, ZnO, CdTe, CdZnTe, ceramics, polytetrafluoroethylene, and/or $Al_2O_3$, for example, or any other substrate material that may be suitable for integrating microstrip structures.

In operation, a bias and/or a signal voltage may be applied across the signal conductive line 723 and the ground plane 725, and/or the signal conductive lines 731 and 733. The thickness of a leaky wave antenna resonant cavity may be dependent on the distance between the conductive lines in the microstrip waveguide 720 and/or the coplanar transmission waveguide 730.

By alternating patches of conductive material with insulating material, or slots of conductive material in dielectric material, a partially reflective surface may result, which may allow a signal to "leak out" in that direction, as shown by the Leaky Wave arrows in FIG. 7. In this manner, wireless signals may be directed out of the surface plane of the support structure 701, or parallel to the surface.

The deflection of the signal conductive lines 723, 731, and/or 733 may tune the resonant frequency of the cavity as well as adjust the impedance seen by a PA and/or LNA coupled to the waveguide. Thus, by incorporating switchable inductors and capacitors between the PA and/or LNA and the leaky wave antennas, dynamic tuning of the output power efficiency may be enabled.

Figure 8A:
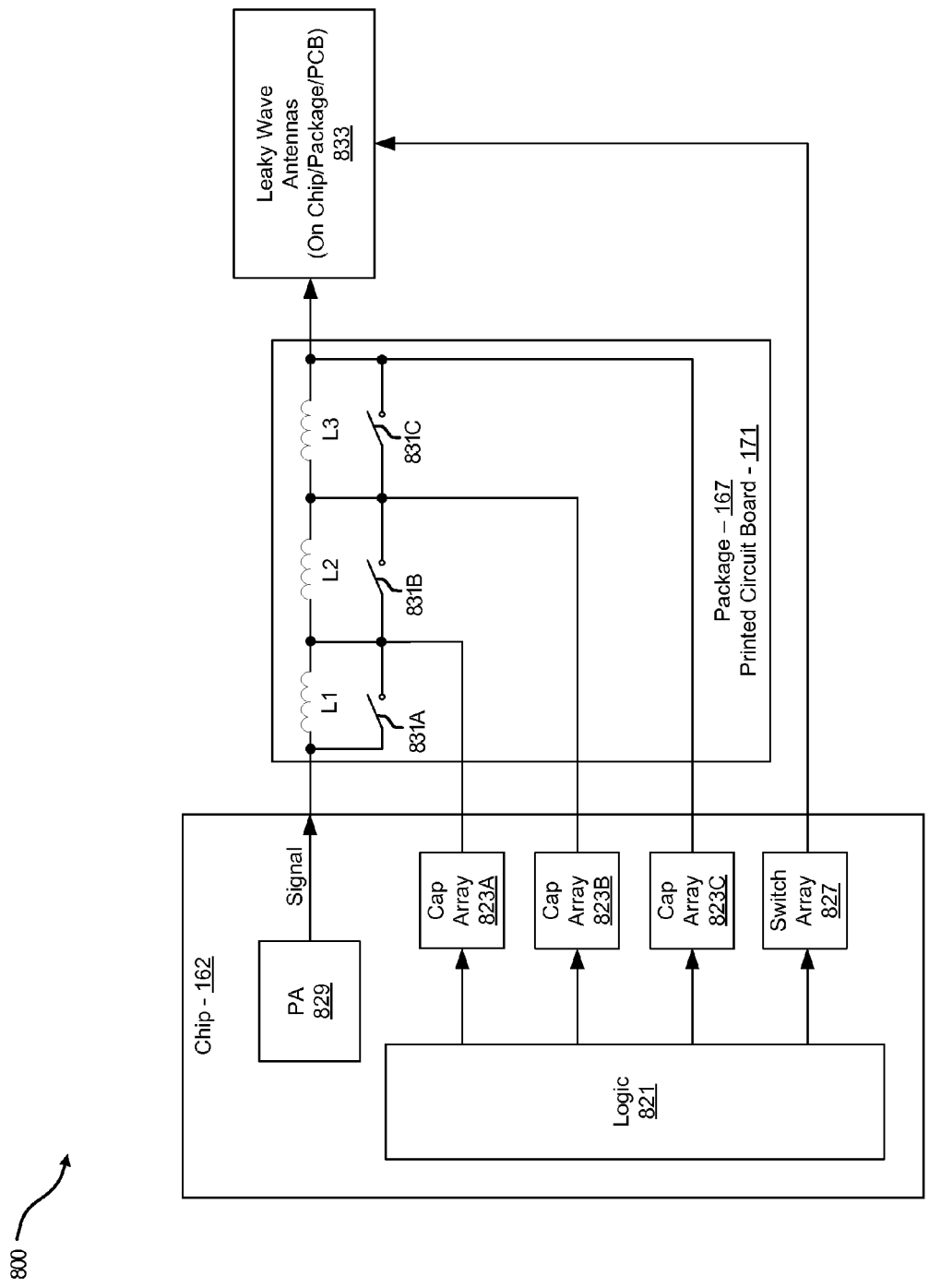
FIG. 8A is a block diagram of exemplary leaky wave antennas and associated circuitry, in accordance with an embodiment of the invention.

FIG. 8A is a block diagram of exemplary leaky wave antennas and associated circuitry, in accordance with an embodiment of the invention. Referring to FIG. 8A, there is shown tunable antenna system 800 comprising the chip 162, the package 167 or printed circuit board 171, and leaky wave antennas 833. The chip 162 may comprise a logic block 821, capacitor arrays 823A-823C, switch array 827, and a PA 829.

The logic block 821 may comprise suitable circuitry, logic and/or code for controlling the capacitor arrays 823A-823C and the switch array 827. The capacitor arrays 823A-823C may comprise individually addressable arrays of capacitors that may be utilized for impedance matching with the leaky wave antennas 833. The capacitor arrays 823A-823C may receive as inputs, control signals from the logic block 821.

The switch array 827 may comprise individually addressable switches, an array of transistors or MEMS switches, for example, that may be enabled to activate one or more antennas in the leaky wave antennas 833. The switch array 827 may receive as inputs, control signals from the logic block 821. Enabling one or more antennas for a particular band may allow smart antenna techniques such as beam forming and multi-antenna diversity to be utilized.

The package 167 or printed circuit board 171 may comprise inductors L1, L2 and L3, and switches 831A-831C. The switches 831A-831C may be utilized to bypass the inductors L1, L2 and L3, thus changing the impedances in the LC circuit formed by the inductors L1, L2 and L3, and the capacitor arrays 823A-823C. This may be performed to impedance match the selected antenna from the leaky wave antennas 833 to the PA 829. The invention is not limited in the number of inductors illustrated in FIG. 8A. The number of inductors may be determined by the impedance matching requirements of the leaky wave antennas 833 and/or the type of inductors that are employed. In this manner, another degree of impedance matching control may be enabled. The impedance of the selected leaky wave antenna 833 may be configured via selection of an appropriate feed point as described with respect to FIG. 6, and the inductance and capacitance in the circuit may be further configured utilizing the inductors L1-L3 and the capacitor arrays 823A-823C.

The leaky wave antennas 833 may comprise an array of individually addressable leaky wave antennas with different resonant frequency, impedance, and/or direction of transmission and/or reception, for example. Each antenna may be designed to transmit in a particular frequency range, and may also be tunable within that frequency range via MEMS deflection.

In operation, an analog input signal may be communicated from the PA 829 to the inductors L1, L2 and/or L3 in the package 167 or printed circuit board 171 and to a selected antenna or antennas of the leaky wave antennas 833 for wireless transmission. The required inductance may be determined by the impedance of the selected antenna or antennas, and may be configured by the switches 831A-831C. The required capacitance may be determined by the logic block 821, which may enable an appropriate capacitor array 823A-823C, may also depend on the impedance of the selected antenna or antennas. The antenna or antennas of the leaky wave antennas 833 that may be utilized to transmit the analog input signal may be selected utilizing the switch array 827. The selection of the antennas may depend on the frequency of the analog input signal and/or the desired beam shape and/or polarization, for example.

The output power transmitted by the leaky wave antennas 833 may be maximized by dynamically configuring the impedances to match resonant frequencies, such as the resonant frequency of the enabled leaky wave antenna, the frequency of the signal generated by the PA 829, and the resonant frequency of the LC circuit coupling the PA 829 to the enabled leaky wave antenna. A high degree of control of the output power may be enabled utilizing the configurable impedances provided by the switchable inductors L1-L3 and the capacitor arrays 823A-823C, and by configuring the resonant frequency and impedance of the leaky wave antennas 833.

Figure 8B:
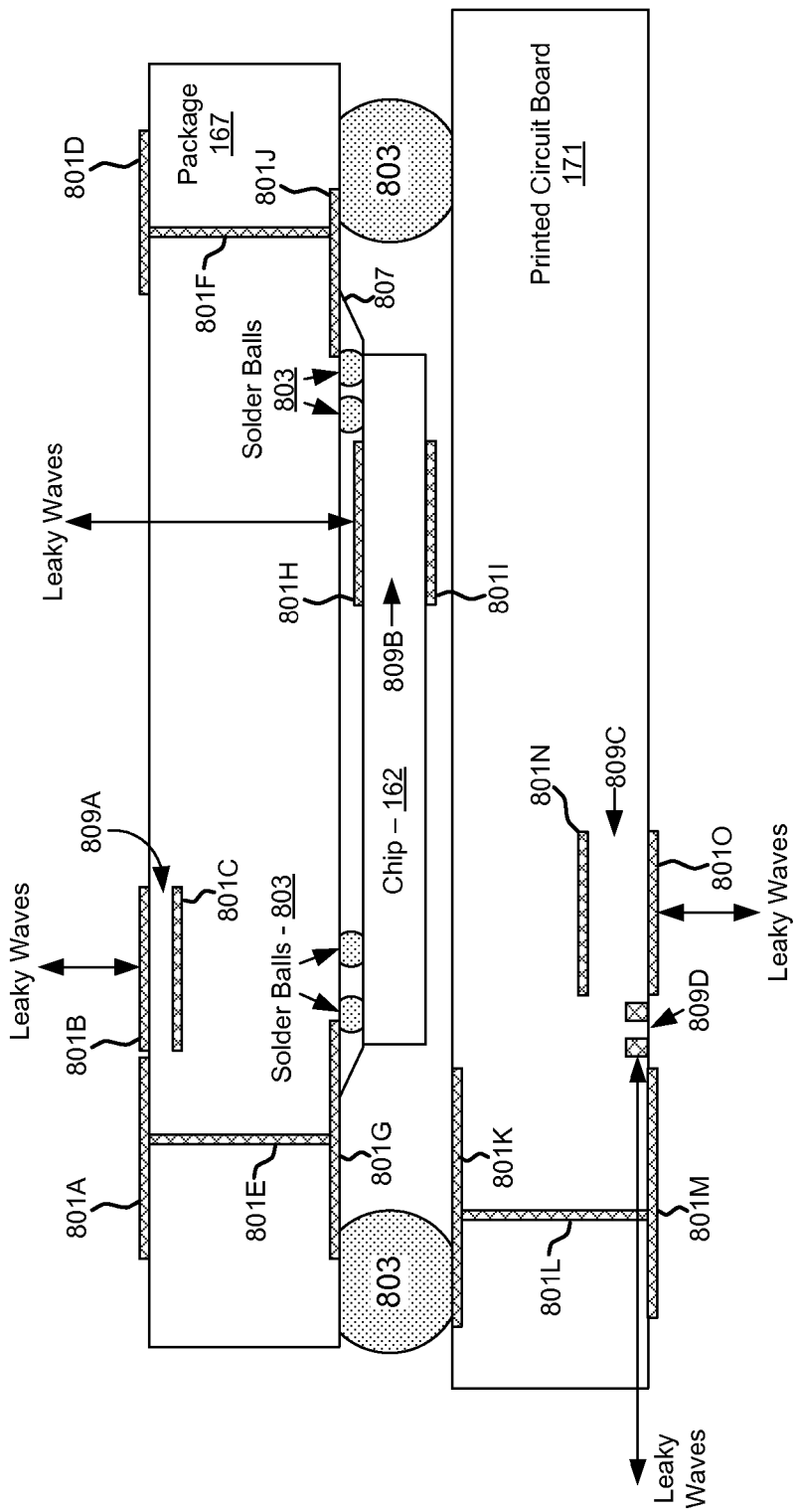
FIG. 8B is a diagram illustrating wireless communication via dynamically controlled output power of leaky wave antennas, in accordance with an embodiment of the invention.

FIG. 8B is a diagram illustrating wireless communication via dynamically controlled output power of leaky wave antennas, in accordance with an embodiment of the invention. Referring to FIG. 8B, there is shown metal layers 801A-801O, solder balls 803, thermal epoxy 807, and leaky wave antennas 809A-809C. The chip 162, the package 167, and the printed circuit board 171 may be as described previously.

The chip 162, or integrated circuit, may comprise one or more components and/or systems within the wireless system 150. The chip 162 may be bump-bonded or flip-chip bonded to the package 167 utilizing the solder balls 803. Similarly, the package 167 may be flip-chip bonded to the printed circuit board 171. In this manner, wire bonds connecting the chip 162 to the package 167 and the package 167 to the printed circuit board 171 may be eliminated, thereby reducing and/or eliminating uncontrollable stray inductances due to wire bonds, for example. In addition, the thermal conductance out of the chip 162 may be greatly improved utilizing the solder balls 803 and the thermal epoxy 807. The thermal epoxy 807 may be electrically insulating but thermally conductive to allow for thermal energy to be conducted out of the chip 162 to the much larger thermal mass of the package 167.

The metal layers 801B, 801C, 801H, 801I, 801N, and 801O may comprise deposited metal layers utilized to delineate leaky wave antennas in and/or on the chip 162, the package 167, and the printed circuit board 171. The metal layers 801A, 801D-801G, 801J-801M may comprise deposited metal layers utilized to delineate inductors, such as the inductors L1-L3 described with respect to FIG. 8A, for configuring an impedance between a PA and a leaky wave antennas.

The leaky wave antennas 809A-809C may be utilized to communicate signals between devices in the chip 162, the package 167, and the printed circuit board 171 to other devices. In addition, the leaky wave antenna 809D may comprise conductive and insulating layers integrated in and/or on the printed circuit board 171 extending into the cross-sectional view plane to enable communication of signals horizontally in the plane of the printed circuit board 171, as illustrated by the coplanar waveguide 730 described with respect to FIG. 7.

In an embodiment of the invention, the spacing between pairs of metal layers, for example 801B and 801C, 801H and 801I, and 801N and 801O, may define vertical resonant cavities of leaky wave antennas. In this regard, a partially reflective surface, as shown in FIGS. 2 and 3, for example, may enable the resonant electromagnetic mode in the cavity to leak out from that surface.

The metal layers 801B, 801C, 801H, 801I, 801N, and 801O may comprise microstrip structures as described with respect to FIG. 7. The region between the metal layers 801B, 801C, 801H, 801I, 801N, and 801O may comprise a resistive material that may provide electrical isolation between the metal layers 801A-801F thereby creating a resonant cavity. In an embodiment of the invention, the region between the metal layers 801B, 801C, 801H, 801I, 801N, and 801O may comprise air and/or dielectric material, thereby enabling MEMS actuation of the metal layers 801B, 801C, 801H, 801I, 801N, and 801O.

The number of metal layers is not limited to the number of metal layers 801A-801O shown in FIG. 8B. Accordingly, there may be any number of layers embedded within and/or on the chip 162, the package 167, and/or the printed circuit board 171, depending on the number of leaky wave antennas, traces, waveguides and other devices fabricated.

The solder balls 803 may comprise spherical balls of metal to provide electrical, thermal and physical contact between the chip 162, the package 167, and/or the printed circuit board 171. In making the contact with the solder balls 803, the chip 162 and/or the package 167 may be pressed with enough force to squash the metal spheres somewhat, and may be performed at an elevated temperature to provide suitable electrical resistance and physical bond strength. The thermal epoxy 807 may fill the volume between the solder balls 803 and may provide a high thermal conductance path for heat transfer out of the chip 162.

In operation, the chip 162 may comprise an RF front end, such as the RF transceiver 152, described with respect to FIG. 1, and may be utilized to transmit and/or receive RF signals, at 60 GHz, for example. The chip 162 may be electrically coupled to the package 167. The package 167 may be electrically coupled to the printed circuit board 171. In instances where high frequency signals, 60 GHz or greater, for example, may be communicated between blocks or regions in the chip 162 and/or to and from the chip to external devices, leaky wave antennas may be utilized.

Lower frequency signals may be communicated via leaky wave antennas with larger resonant cavity heights, such as the leaky wave antennas integrated with the full width of the printed circuit board 171. However, higher frequency signal signals may also be communicated from leaky wave antennas integrated in the printed circuit board 171 by utilizing coplanar waveguide leaky wave antennas, such as the leaky wave antennas 809D, or by utilizing microstrip waveguide leaky wave antennas with lower cavity heights.

The leaky wave antenna 809D may comprise coplanar waveguide structures, for example, and may be operable to communicate wireless signals in the horizontal plane, parallel to the surface of the printed circuit board 171. In this manner, signals may be communicated between disparate regions of the printed circuit board 171 without the need to run lossy electrical signal lines. The leaky wave antennas 809A-809C may comprise microstrip waveguide structures, for example, that may be operable to wirelessly communicate signals perpendicular to the plane of the supporting structure, such as the chip 162, the package 167, and the printed circuit board 171. In this manner, wireless signals may be communicated from the chip 162 to the package 167, and/or the printed circuit board 171, and also to devices external to the wireless device 150.

The inductors formed from the metal layers 801A, 801D-801G, 801J-801M may be utilized for impedance and resonant frequency matching between a PA providing a signal to be transmitted and the leaky wave antenna to transmit the signal. For example, a PA in the chip 162 may generate a signal for transmission, that may be communicated to an impedance control circuit comprising addressable capacitors, such as the capacitor arrays 823A-823C in FIG. 8A, and inductors defined by the metal layers 801A, 801D-801G, 801J-801M. The signal may then be communicated to a leaky wave antenna, such as the leaky wave antennas 809A-809D, for transmission.

The integration of leaky wave antennas in the chip 162, the package 167, and the printed circuit board 171 may result in the reduction of stray impedances when compared to wire-bonded connections between structures as in conventional systems, particularly for higher frequencies, such as 60 GHz. In this manner, volume requirements may be reduced and performance may be improved due to lower losses and accurate control of impedances via switches in the chip 162 or on the package 167, for example.

The integration of leaky wave antennas in the printed circuit board 171 may enable a larger range of cavity heights and number of antennas as compared to the package 167 and the chip 162. In addition, more fabrication techniques may be available for integrating leaky wave antennas in printed circuit boards as compared to ceramic packages and/or semiconductor chips.

Figure 9:
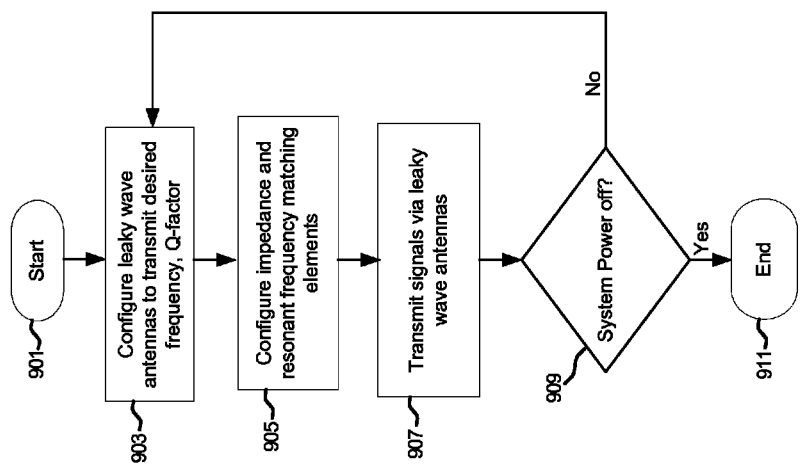
FIG. 9 is a block diagram illustrating exemplary steps for dynamically configuring output power of leaky wave antenna, in accordance with an embodiment of the invention.

FIG. 9 is a block diagram illustrating exemplary steps for dynamically configuring output power of leaky wave antenna, in accordance with an embodiment of the invention. Referring to FIG. 9, in step 903 after start step 901, one or more leaky wave antennas may be configured to communicate wireless signals by coupling to RF power amplifiers of low noise amplifiers, for example. In step 905, impedance and resonant frequency matching elements may couple a PA to the selected leaky wave antenna. In step 907, signals may be transmitted via the selected leaky wave antenna. In step 909, in instances where the wireless device is to be powered down, the exemplary steps may proceed to end step 911. In step 909, in instances where the wireless device 150 is not to be powered down, the exemplary steps may proceed to step 903 to configure the leaky wave antenna at a desired frequency.

In an embodiment of the invention, a method and system are disclosed for configuring one or more leaky wave antennas 164A-164C, 400, 420, 600, 809A-809D, and 833 in a wireless device 150 to transmit RF signals at a desired frequency. The leaky wave antennas 164A-164C, 400, 420, 600, 809A-809D, and 833 may be integrated in one or more support structures 162, 167, and/or 171. One or more impedances 823A-823C and L1-L3, may be dynamically configured that are coupled to the one or more enabled leaky wave antennas 164A-164C, 400, 420, 600, 809A-809D, and 833 and to a power amplifier 829 enabled to amplify the RF signals. A resonant frequency of the one or more enabled leaky wave antennas 164A-164C, 400, 420, 600, 809A-809D, and 833 may be tuned. The support structures 162, 167, and/or 171 may comprise one or more of: an integrated circuit 162, an integrated circuit package 167, and a printed circuit board 171. The one or more enabled leaky wave antennas 164A-164C, 400, 420, 600, 809A-809D, and 833 may be configured to transmit the RF signals at a desired angle from a surface of the support structure 162, 167, and/or 171. The RF signals may be communicated between regions within the support structures 162, 167, and/or 171. The one or more leaky wave antennas 164A-164C, 400, 420, 600, 809A-809D, and 833 may comprise microstrip waveguides 720 where a cavity height of the one or more leaky wave antennas 164A-164C, 400, 420, 600, 809A-809D, and 833 may be configured by controlling spacing between conductive lines 723 and 725 in the microstrip waveguides 720. The one or more leaky wave antennas comprise coplanar waveguides 730 where a cavity height of the one or more leaky wave antennas 164A-164C, 400, 420, 600, 809A-809D, and 833 may be configured by controlling spacing between conductive lines 731 and 733 in the coplanar waveguides 730. The one or more impedances may comprise capacitor arrays 823A-823C and/or inductors L1-L3 in the one or more support structures 162, 167, and/or 171.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for dynamic control of output power of a leaky wave antenna.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication by a wireless device including at least one leaky wave antenna integrated in a support structure and including a resonant cavity formed by a first planar reflective surface and a second planar reflective surface having a reflectivity lower than the first planar reflective surface, the method comprising:

causing the at least one leaky wave antenna to transmit an RF signal at a desired frequency by selecting one feed point from a plurality of feed points of the at least one leaky wave antenna, each of the plurality of feed points being disposed within the resonant cavity at a different distance from the first planar reflective surface to set a different impedance, the selected one feed point determining an impedance of the at least one leaky wave antenna; and dynamically adjusting one or more impedances coupled to the leaky wave antenna and to a power amplifier that amplifies said RF signal, by selecting individually addressable capacitor arrays and switches that bypass inductors to match the impedance of the at least one leaky wave antenna.

2. The method according to claim 1, wherein the support structure is at least one of an integrated circuit, an integrated circuit package, and a printed circuit board.

3. The method according to claim 1, further comprising: causing the at least one leaky wave antenna to transmit said RF signal at a desired angle from a surface of said support structure.

4. The method according to claim 1, comprising: communicating said RF signal between regions within said support structure.

5. The method according to claim 1, wherein the at least one leaky wave antenna includes microstrip waveguides.

6. The method according to claim 5, wherein a cavity height of said at least one leaky wave antenna is based on a spacing between conductive lines in said microstrip waveguides.

7. The method according to claim 1, wherein the at least one leaky wave antenna includes coplanar waveguides.

8. The method according to claim 7, wherein a cavity height of the at least one leaky wave antenna is based on a spacing between conductive lines in said coplanar waveguides.

9. The method according to claim 1, wherein said one or more impedances coupled to the at least one leaky wave antenna are placed in the support structure.

10. The method according to claim 1, wherein said one or more impedances coupled to the at least one leaky wave antenna include switchable inductors placed in the support structure.

11. The method according to claim 1, further comprising dynamically tuning a resonant frequency of the at least one leaky wave antenna.

12. A system for enabling communication, the system comprising:
  circuitry including at least one leaky wave antenna integrated in a support structure and including a resonant cavity formed by a first planar reflective surface and a second planar reflective surface having a reflectivity lower than the first planar reflective surface, the circuitry configured to:
    cause the at least one leaky wave antenna to transmit an RF signal at a desired frequency by selecting one feed point from a plurality of feed points of the at least one leaky wave antenna, each of the plurality of feed points being disposed within the resonant cavity at a different distance from the first planar reflective surface to set a different impedance, the selected one feed point determining an impedance of the at least one leaky wave antenna;
    dynamically adjust one or more impedances coupled to the at least one leaky wave antenna and to a power amplifier that amplifies said RF signal, by selecting individually addressable capacitor arrays and switches that bypass inductors to match the impedance of the at least one leaky wave antenna.

13. The system according to claim 12, wherein the support structure is at least one of an integrated circuit, an integrated circuit package, and a printed circuit board.

14. The system according to claim 12, wherein the circuitry is further configured to cause the at least one leaky wave antenna to transmit said RF signal at a desired angle from a surface of said support structure.

15. The system according to claim 12, wherein the circuitry is operable to communicate said RF signal between regions within said support structure.

16. The system according to claim 12, wherein the at least one leaky wave includes microstrip waveguides.

17. The system according to claim 16, wherein a cavity height of said at least one leaky wave antenna is based on a spacing between conductive lines in said microstrip waveguides.

18. The system according to claim 12, wherein said at least one leaky wave antenna includes coplanar waveguides.

19. The system according to claim 18, wherein a cavity height of said at least one leaky wave antenna is based on a spacing between conductive lines in said coplanar waveguides.

20. The system according to claim 12, wherein said one or more impedances coupled to the at least one leaky wave antenna are placed in the support structure.

* * * * *